Dec. 19, 1967 J. A. FAZIO 3,359,506

INSTANTANEOUS REFERENCE VOLTAGE FOR D.C. VOLTAGE CONTROLLED OSCILLATOR

Filed March 10, 1965

INVENTOR:
JAMES A. FAZIO,
BY William S. Wolfe
HIS ATTORNEY.

United States Patent Office 3,359,506
Patented Dec. 19, 1967

3,359,506
INSTANTANEOUS REFERENCE VOLTAGE FOR D.C. VOLTAGE CONTROLLED OSCILLATOR

James Anthony Fazio, Liverpool, N.Y., assignor to General Electric Company, a corporation of New York Filed Mar. 10, 1965, Ser. No. 438,599
4 Claims. (Cl. 331—20)

ABSTRACT OF THE DISCLOSURE

A voltage controlled oscillator circuit comprises a phase discriminator circuit and an RC input circuit including a large capacitor for filtering a D.C. control voltage. Another capacitor which is connected in series with the large capacitor of the RC filter is connected across a D.C. supply voltage to provide a capacitive voltage divider with an instantaneous reference voltage at a midpoint thereof.

Figure 1:
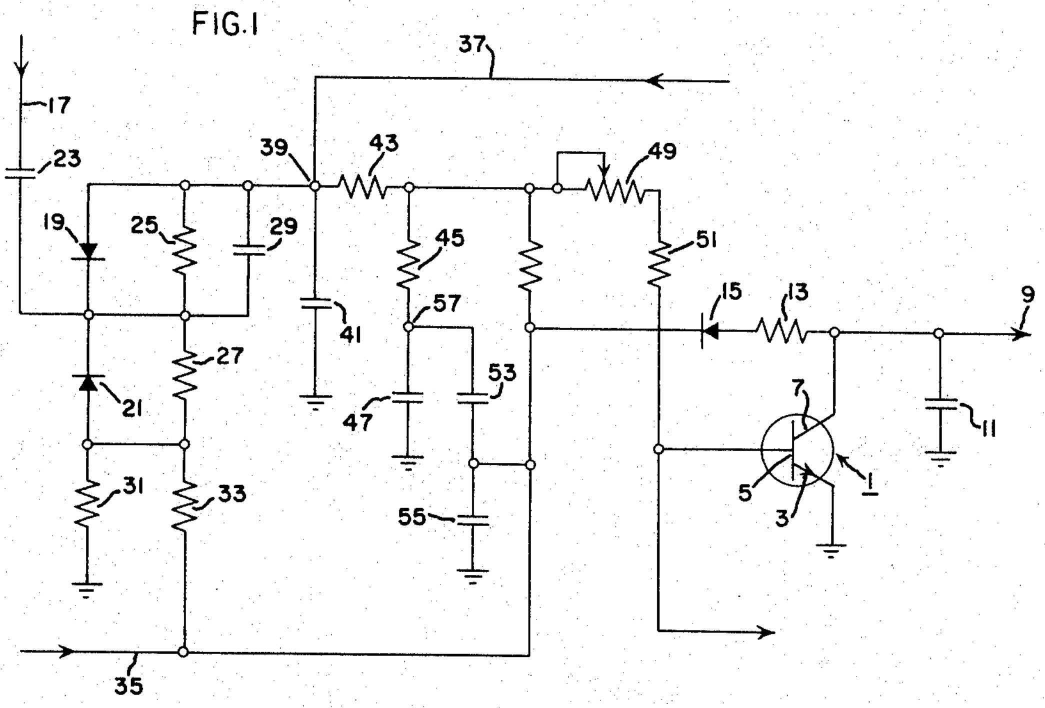

This invention relates generally to a circuit for instantaneously providing a reference voltage for a D.C. voltage controlled oscillator upon the application of power to the oscillator. More particularly, this invention relates to a capacitive voltage divider circuit for instantaneously providing a reference voltage for the horizontal oscillator of a television receiver upon application of power to the receiver.

In a television receiver horizontal sweep pulses are conventionally produced by a horizontal oscillator. In order to have the horizontal oscillator produce sweep pulses at a desired rate, it is necessary to control the frequency of the oscillator. This is done by producing a D.C. control voltage. The oscillator is arranged so that its center frequency of oscillation is produced in response to a center frequency control voltage, or reference voltage. For a vacuum tube oscillator the reference voltage is at zero, but for a transistor oscillator the reference voltage has a non-zero value. Variations in the oscillator frequency are detected by comparing the oscillator output with synchronizing pulses in a discriminator. The output of the discriminator is a slowly changing D.C. error signal which serves as the control voltage. A low pass RC filter circuit is used to couple the D.C. control voltage to the oscillator and to prevent any higher frequencies from being conducted to the oscillator. The D.C. control voltage is applied to the oscillator to keep the oscillator frequency at the value dictated by the synchronizing pulses.

Since the reference voltage for a vacuum tube circuit is zero, the low pass filter does not introduce any problems. However, in a transistor circuit the resistance in the filter circuit must be decreased, and the capacitance correspondingly increased, in order to provide a low input impedance for the transistor oscillator. Also, due to the nature of the transistor oscillator, the center frequency control voltage of the oscillator must be at a value between the supply voltage and ground. To reach this value it is necessary for the large capacitor in the filter circuit to be charged to the desired potential, such charging producing a time lag between application of power to the receiver and the provision of a desired reference voltage. This time lag is undesirable because an unsynchronized picture is produced for the viewer during the time lag. For instance, if the receiver is switched off and immediately back on so that the filaments remain hot and a raster remains, a time lag will be required before the capacitor charges to the desired reference voltage level and locks the oscillator on its center frequency. During this time the unsynchronized picture is formed on the screen and is seen by the viewer.

Therefore, it is an object of this invention to provide a non-zero reference voltage of a predetermined value for a D.C. voltage controlled oscillator instantaneously with the application of power to the oscillator.

Another object of this invention is to prevent the formation of an unsynchronized picture on a television receiver screen immediately after application of power to the receiver.

Yet another object of this invention is to provide a control voltage circuit suitable for use with a transistorized horizontal oscillator of a television receiver.

Briefly, in one form thereof, this invention involves the use of a capacitive voltage divider in a transistorized television receiver. A transistor oscillator, more particularly the horizontal oscillator of the television receiver, is arranged to provide an output which has a frequency dependent upon the value of the D.C. control voltage applied to the oscillator. This D.C. control voltage is produced from the comparison of synchronization pulses with the oscillator output in a discriminator. The control voltage is connected to the oscillator through a low pass filter, which includes a series connected resistor and capacitor in parallel with the input. Since a non-zero control voltage is necessary to achieve the desired center frequency of operation of the oscillator, a reference voltage of the desired non-zero magnitude is needed immediately upon application of power to the television receiver. This reference voltage is obtained by connecting an additional capacitor from the midpoint of the series combination of the capacitor and resistor in the filter circuit to a D.C. voltage source. Thus, the additional capacitor and the capacitor originally appearing in the filter network act as a voltage divider and, by properly choosing the capacitor magnitudes, the desired reference voltage is applied to the oscillator. This permits the reference voltage to be instantaneously obtained for the oscillator upon application of power to the receiver, rather than having to wait until the capacitor in the filter circuit is charged to this voltage.

Figure 2:
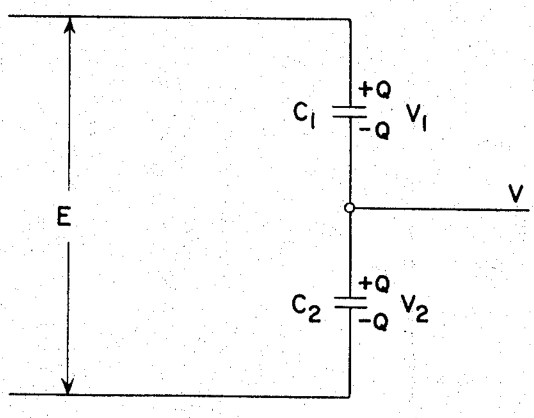

The novel and distinctive features of the invention are set forth in the appanded claims. The invention itself, together with further objects and advantages thereof, may be understood by reference to the followнig description and accompanying drawings in which:

FIGURE 1 is a schematic circuit diagram of a particular circuit utilizing the capacitive voltage divider arrangement of this invention; and FIGURE 2 is a schematic circuit diagram of a capacitive voltage divider.

Referring to FIGURE 1 of the drawings, a specific embodiment of an oscillator is shown. The oscillator includes a transistor 1, which has an emitter 3, a base 5, and a collector 7. This oscillator may be for example, the horizontal oscillator which conventionally produces horizontal sweep pulses for the television scanning process. The horizontal oscillator output is connected to succeeding stages of the horizontal sweep control from the output 9, which is taken from across capacitor 11. The output 9 is connected to a transformer winding, which is not shown, and resistor 13 and diode 15 are placed in the circuit to aid in damping flyback pulses coming from the transformer winding.

To regulate the frequency of operation of the transistor oscillator 1, synchronization (sync) pulses are obtained from a clipper circuit on lead 17. The sync pulses on lead 17 are applied to a discriminator at the midpoint of back-to-back diodes 19 and 21, through capacitor 23. Resistances 25 and 27 are connected across diodes 19 and 21, respectively, in order to provide a balanced circuit to eliminate the effects of differences in the back resistances of diodes 19 and 21. Similarly, capacitor 29 is connected across diode 19 to provide a balance for capacitor 23, which is essentially connected across diode 21. Completing the discriminator circuit, resistor 31 is connected to ground and resistor 33 is connected to a D.C. supply voltage appearing on line 35.

In order to control the frequency of the transistor oscillator 1, a D.C. control voltage must be formed. The discriminator circuit produces the D.C. control voltage by comparing the sync pulses on lead 17 with the horizontal output across diodes 19 and 21 in a known manner. The horizontal output is fed back through line 37 and has a frequency that is the same as that of the horizontal oscillator, so that the discriminator compares the signals and produces a control voltage that depends upon the frequency of the horizontal oscillator. This control voltage, which appears at point 39, is then used to correct the frequency of the oscillator so that it coincides with the frequency of the sync pulses. If the oscillator is at the proper frequency there will be no control voltage produced by the discriminator.

The output of the discriminator at point 39 is applied to a low pass filter comprising capacitor 41, resistors 43 and 45 and capacitor 47. This filter circuit will pass the relatively low frequency variations in the control voltage, but will prevent the feedback pulses and any other higher frequency signals from being passed. In addition, the circuit parameters are chosen so that the charge produced on capacitor 47 is equivalent to the center frequency voltage, or reference voltage of the oscillator. After passing through the filter circuit the D.C. control voltage is applied to base 5 of the transistor 1, through a variable resistance 49 and a fixed resistor 51.

In the circuit described to this point there is the problem that it takes a finite time for capacitor 47 to charge to the reference voltage level. During the time prior to the charging of capacitor 47 to the reference level, the oscillator is unsynchronized and a viewer is subjected to an unsynchronized picture on the screen. To overcome this difficulty, applicant has added capacitor 53 so that capacitors 47 and 53 form a capacitive voltage divider. The capacitor 55 is a filter capacitor.

The advantages of this arrangement will be better understood by reference to FIGURE 2. In this figure a D.C. voltage E is applied across the series connection of first and second capacitors $C_1$ and $C_2$. The total capacitance of the series connection may be given by the expression:

$$\frac{1}{C}=\frac{1}{C_1}+\frac{1}{C_2} \tag{1}$$

which yields the well-known expression:

$$C=\frac{C_1C_2}{C_1+C_2} \tag{2}$$

The voltage E, in terms of the total capacitance C and the total charge Q of the circuit is given as:

$$E=\frac{Q}{C} \tag{3}$$

Similarly, the voltage $V_1$ across capacitor $C_1$ and the voltage $V_2$ across capacitor $C_2$ may be given as:

$$V_1=\frac{Q_1}{C_1} \tag{4}$$

and $$V_2=\frac{Q_2}{C_2} \tag{5}$$

where $Q_1$ and $Q_2$ are the charges on each of the capacitors respectively. However, in a series connection the charge on the lower plate of $C_1$ must have the same magnitude as the opposite charge on the top plate of capacitor $C_2$, so that:

$$Q=Q_1=Q_2 \tag{6}$$

Thus, the expression for $V_2$ then becomes:

$$V_2=\frac{Q}{C_2} \tag{7}$$

and substituting from the equation for Q from Equation 3 above the expression becomes:

$$V_2=\frac{EC}{C_2} \tag{8}$$

Since V is equal to $V_2$, and substituting the expression for C from Equation 2 above, the result is:

$$V=\frac{C_1}{C_1+C_2}E \tag{9}$$

By the use of the final Formula 9 above it is seen that a desired value V may be obtained by choosing the proper values for $C_1$ and $C_2$. Since the charges on the lower plate of $C_1$ and the upper plate of $C_2$ must always be the same, regardless of any charging rates involved, it will be appreciated that the value V will be the desired reference value immediately upon application of the voltage E and at all times thereafter. Applying this conclusion to the circuit of FIGURE 1, it follows that the desired reference voltage may be obtained at point 57 instantaneously with application of the supply voltage on line 35. Since the supply voltage on line 35 is directly connected with the application of power to the television receiver, it means that the reference voltage for the oscillator is obtained instantaneously with the application of power to the television receiver and no loss of synchronized viewing is experienced.

Although the invention has been described with respect to a certain specific embodiment, it will be appreciated that modifications and changes may be made by those skilled in the art without departing from the basic teachings of the invention. Therefore, it is desired not to limit the following claims to the specific embodiment shown, but to cover all modifications and changes within the spirit and scope of the invention.

What I claim as new and desire to be secured by Letters Patent of the United States is:

1. In an oscillator circuit the combination comprising:
(a) a D.C. supply voltage,
(b) means for producing a D.C. control voltage,
(c) a solid state D.C. controlled oscillator,
(d) circuit means connected between said means for producing a D.C. control voltage and said oscillator comprising a capacitive voltage divider including a pair of capacitors connected across said D.C. supply voltage to instantaneously provide a D.C. reference voltage for said oscillator at a midpoint of the capacitive voltage divider upon application of power to the circuit.

2. In an oscillator circuit the combination comprising:
(a) a D.C. voltage controlled transistor oscillator,
(b) means for producing a D.C. control voltage to control the frequency of said oscillator,
(c) RC circuit means including a resistance and a first capacitor connected between said means for producing a D.C. control voltage and said oscillator for filtering said D.C. control voltage,
(d) a D.C. supply voltage, and
(e) capacitive voltage divider means including said first capacitor in said RC circuit means and a second capacitor connected across said D.C. supply voltage, a reference voltage being obtained from a midpoint of said voltage divider and being instantaneously applied to said oscillator upon application of said D.C. supply voltage.

3. In a television receiver the combination comprising:
(a) a solid state horizontal oscillator comprising a transistor having emitter, base and collector electrodes,
(b) means for producing a D.C. control voltage to control the frequency of said oscillator,
(c) an RC circuit including a first capacitor connected between said means for producing a D.C. control voltage and the base of said transistor for filtering said D.C. control signal, (d) a D.C. supply voltage obtained from the source of power for the receiver, (e) a second capacitor connected in series with said first capacitor across said D.C. supply voltage as a voltage divider, a D.C. reference voltage of a predetermined magnitude for setting the center frequency of said oscillator being obtained from the midpoint of said voltage divider so that said reference voltage is produced instantaneously with the application of power to the receiver, and (f) means for connecting said reference voltage to said oscillator.

4. In a television receiver the combination comprising:

(a) a solid state horizontal oscillator comprising a transistor having emitter, base and collector electrodes, (b) a discriminator for producing a D.C. control voltage representative of frequency variations in the output of said oscillator, said D.C. control voltage being utilized to control the frequency of said oscillator, (c) an RC circuit connected between said discriminator and the base of said transistor, for filtering said D.C. control signal, said RC circuit comprising a resistor and a first capacitor connected in series with each other, (d) a second capacitor connected to the common terminal of said resistor and said first capacitor, (e) a D.C. supply voltage derived from the power input to the television receiver, said supply voltage connected across the series combination of said first capacitor and said second capacitor, (f) a D.C. reference voltage of a predetermined magnitude for setting the center frequency of said oscillator being obtained from the midpoint of said series combination and applied to the base of said transistor through said resistor, whereby a reference voltage of a predetermined magnitude is obtained for said oscillator instantaneously with the application of power to the television receiver.

References Cited

UNITED STATES PATENTS 3,231,829 1/1966 Reid ............... 331—20

ROY LAKE, *Primary Examiner.*

J. B. MULLINS, *Assistant Examiner.*